United States Patent [19]

Cucchietti et al.

[11] Patent Number: 4,819,080
[45] Date of Patent: Apr. 4, 1989

[54] INSTRUMENT FOR MEASURING THE PHASE JITTER OF ANALOG SIGNALS

[75] Inventors: Flavio Cucchietti; Carlo M. Bruno, both of Turin, Italy

[73] Assignee: Sip - Societa Italiana per L'esercizio Delle Telecomunicazioni P.A., Turin, Italy

[21] Appl. No.: 186,904

[22] Filed: Apr. 27, 1988

[30] Foreign Application Priority Data

Jun. 26, 1987 [IT] Italy ................................ 67552 A/87

[51] Int. Cl.$^4$ ............................................. G01R 25/00
[52] U.S. Cl. .................. 324/83 R; 324/78 R; 375/118; 328/155
[58] Field of Search ............... 324/121 R, 77 R, 78 R, 324/78 D, 79 R, 79 D, 83 R, 83 D, 82, 77 B; 364/487, 574; 375/118, 10; 307/516; 328/155

[56] References Cited

U.S. PATENT DOCUMENTS

| 4,144,489 | 3/1979 | Ward et al. | 324/78 D |
| 4,144,572 | 3/1979 | Starner et al. | 324/83 D |
| 4,149,044 | 4/1979 | Hekimian | 324/121 R |
| 4,320,516 | 3/1982 | Kammerlander | 375/10 |
| 4,412,299 | 10/1983 | Huffman | 324/78 D |
| 4,607,218 | 8/1986 | Stosel | 324/83 D |
| 4,654,861 | 3/1987 | Godard | 324/83 R |

Primary Examiner—Michael J. Tokar
Attorney, Agent, or Firm—Herbert Dubno

[57] ABSTRACT

The instrument measures directly the phase jitter of analog signals emitted on the line by the device under test, even when clock information is not available and when particular specifications and limitations do not allow the use of analog instruments. It uses a circuit which generates a square-wave clock signal with the same phase and frequency characteristics as the signal to be measured, so as a phase comparison with a reference signal can be made. Error signal obtained is filtered, measured and displayed.

3 Claims, 2 Drawing Sheets

INSTRUMENT FOR MEASURING THE PHASE JITTER OF ANALOG SIGNALS

DESCRIPTION

The present invention concerns measurement intruments used in the field of transmission on Integrated Services Digital Network (ISDN) for the check of the good operation of the apparatus and transmission lines and more particularly an instrument for measuring the phase jitter of analog signals.

It is known that in digital transmission systems there is often the necessity of extracting a clock signal from the received data flow, in order to allow receiving apparatus to make correct decisions on the symbols received. The task of this apparatus is greatly facilitated if symbol evaluation can be performed at the optimal instant, coincident with the centre of the signalling period. However, the correct clock extraction is made difficult by the unavoidable presence of noise on the useful signal.

Noise presence may be caused by the transmitted signal distortions due to transmission channel and receiving circuits, interferences due to other signal sources (crosstalk) and effects of the digital sequence transmitted. Owing to said causes clock extracted from the received signal may present a correct frequency, but a phase uncertainty around the exact value. That can be considered an actual phase noise (jitter), increasing error probability in the received symbol valuation. Exceeding values predetermined by CCITT, also the compatibility with the apparatus placed downstream of the receiving circuits may fail.

Jitter measurement can be performed by an instrument which allows the comparison between clock signal at the transmission side and the one extracted from the data flow at the receiving side and detects its variations. In the digital transmission domain, using PCM transmission techniques, there are already available instruments and access points near the terminal apparatus for jitter measurement. However said instruments are not apt for measurements on ISDN. In fact they extract the information from the data flow using analog circuits, as for instance PLL circuits, which till now cannot operate at bit rates used within ISDN, equal to 160 kbit/s and 192 kb/s.

Moreover, said instruments cannot satisfy specifications internationally defined by CCITT for the measurements on ISDN network (see, namely Recommendation I430, Paragraph 8.2.2). According to these specifications jitter is not to be measured by using particular access points at the terminal devicer, but directly on the signal transmitted on line, which in this case is a multi-level analog signal, such as B 3-level code AMI or 4-level 2B-1Q. The measurement instrument is to take into account the only transitions from maximum positive level to to maximum negative level and vice versa (from +1 to −1 and from −1 to +1) and neglect transitions comprising level 0, since small oscillations around this value might be erroneously interpreted as level transitions. An analog circuit cannot operate this discrimination.

Finally, instrument accuracy must be sufficient to evaluate maximum allowed noise, which is equal to 17% of the unitary interval.

The disadvantages above are overcome and the problems solved by the instrument for measuring the phase jitter of analog signals, provided by the present invention, which responds to CCITT specifications relevant to ISDN measurements, is particularly simple and, being mostly implemented with digital circuits, requires no calibration. It allows direct measurements on the transmission line without disturbing its operation and presenting an accuracy better than 1%.

The foregoing and other characteristics of the present invention will be made clearer by the following description of a preferred way of embodiment thereof, given by way of non limiting example, and by the annexed drawings in which.

Figure 1:
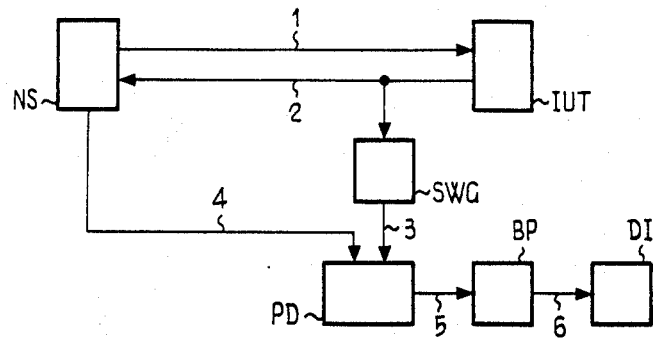
FIG. 1 is a general block diagram of the instrument.

In the block diagram of FIG. 1 NS denotes a data generating apparatus, which transmits through line 1 a three-level AMI-coded signal towards a lower-level apparatus IUT. The latter apparatus uses the data flow receivd to extract the clock information and generates in turn a response data flow it sends to NS through line 2. Clock regenerated by IUT is affected with phase jitter. Said jitter is due to already-mentioned causes (distortions, crosstalks, ecc.), which can be measured at any point of line 2.

To this aim the analog signal must be extracted from line 2 to obtain the jitter-affected clock, without disturbing normal data transmission and adding further errors in phase signal evaluation. This is implemented by the circuit contained in the block denoted by SWG, which is the main object of the invention. At the output on wire 3 block SWG supplies a signal with a frequency equal to that of the digital flow present on line 2 and the phase solely dependant on transistions from +1 to −1 and, vice versa, from −1 to +1.

Wire 3 is connected to the input of a phase detector PD, which receives at the other input a jitter-free reference signal. This signal can be locally-generated or can be supplied by higher hierarchical level apparatus NS through wire 4.

A pass-band filter BP is connected to the output of comparator PD through wire 5. PB is advantageously obtained with two cascaded filters: a single-pole high pass filter with 50 Hz cut-off frequency, for weighting contributions below this frequency, and a low-pass filter with 10 kHz cut-off frequency for eliminating the fundamental frequency of the data flow.

The signal present at BP output on wire 6 is sent to an instrument DI apt to measure its peak-to-peak value, proportional to the phase difference between the reference signal and the noise-affected signal, and to display it.

Figure 2:
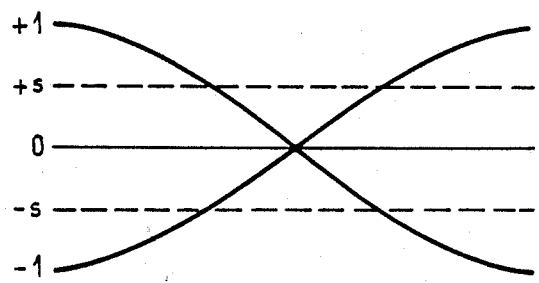
FIG. 2 is a time diagram relevant to the signal to be measured.

FIG. 2 shows a time diagram of two transitions from level +1 to −1 and from −1 to +1 of the signal present on line 2 at the instrument input. On the diagram also levels +s and −s are indicated. They correspond to two threshold voltages whose amplitude is about half the values of positive and negative peak of the analog signal. From the analog signal comparison with those levels and the null level, the present type of transition and zero-crossing instant can be determined.

The zone comprised between the two threshold levels +s and −s will be defined hereinafter as "internal zone" and zones with voltages higher than +s or lower than −s "external zones".

Figure 3:
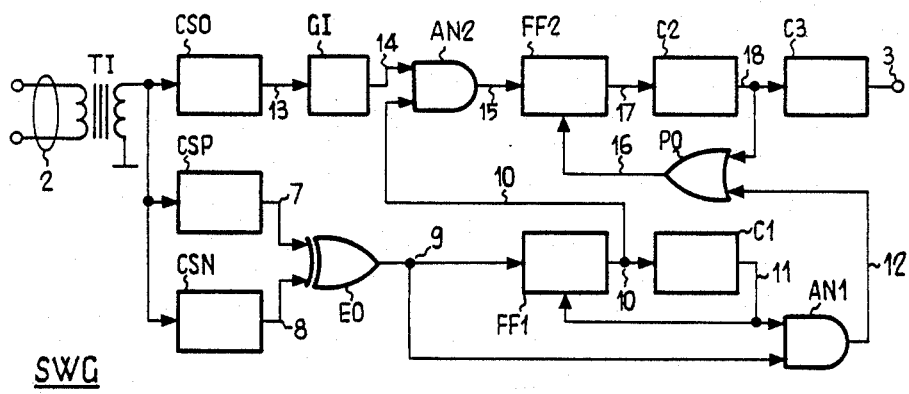
FIG. 3 is a block diagram of the block denoted by SWG in FIG. 1.

According to the invention, to distinguish between a transition from level +1 to −1, or vice versa, and a transition towards the internal zone or coming therefrom, the instrument examine if after a time interval equal to half the signalling period from the passage to an external zone to the internal one, the signal has passed to the other external zone. If that occurs the transition can be used for measurement operations and the relevant zero crossing can be extracted for generating clock signal. If, on the contrary, it does not occur, the transition is towards zero level, hence invalid. FIG. 3 represents the block diagram of the circuit provided by the invention, denoted by SWG in FIG. 1.

TI denotes a transformer apt to galvanically separate transmission line 2, whereto it is connected by primary winding, from the circuit. Moreover it conveniently matches the impedances so that normal transmission be not disturbed during measurements.

CSO, CSP and CSN denote three threshold comparators, which compare input signal with null threshold, the positive threshold +s and the negative threshold −s respectively. As mentioned, s is equal to about half the peak value of the signal. The outputs of comparators CSP and CSN, connected to wires 7 and 8, present a logic level 1 when the respective threshold is exceeded, a logic level 0 in the opposite case. Hence they are both at logic level 1 when the signal is in the upper external zone, both at logic level 0 when the signal is in the lower external zone, one at logic level 0 and the other at logic level 1 when the signal is in the internal zone. Said outputs are connected to the inputs of an EX-OR gate, denoted by EO, which then supplies its output connected to wire 9 with a logic level 1 when the analog signal at the instrument input is in the so-called internal zone (different inputs) and a signal at logic level 0 when the analog signal is in one of the two external zones (equal inputs). A transition from 0 to 1 at the output of EO indicates hence that the analog signal is passed from an external zone to an internal zone. Wire 9 is connected to the clock input of a D type flip-flop, denoted by FF1, whose data input is permanently set at logic level 1. A transition from 0 to 1 on wire 9 makes FF1 output, connected to wire 10, go to logic value 1. This signal enables a divide-by-128 counter C1 to begin counting a clock signal with frequency equal to 128 times the rate of the data flow under test. When the counter has counted the 64th pulse, a time interval has elapsed equal to half the signalling period and C1 output, connected to wire 11, passes to logic level 1. This transition is used to reset to zero the output on wire 10 of flip-flop FF1 and then reset to zero the counter output. As a consequence, only short pulses are available at C1 output on wire 11.

In case line signal has undergone a transition from an external zone to the other, at the end of the half-period counted by C1 the signal at the output of EO has already come back to level 0, in fact it has remained at 1 only for the time necessary to cross the two thresholds. Hence the signal at the output of AND gate denoted by AN1 remains at level 0. On the contrary, in case of transitions towards the internal zone, EO output signal on wire 9 remains at level 1, therefore at AN1 output there is the short pulse generated by C1 at the end of its counting. This pulse, as will be seen afterwards, is used to block the transfer to the output of possible signals corresponding to zero crossings of the analog line signal.

Said zero crossings are detected by threshold comparator CSO, whose transitions at the output connected to wire 13 are used by a pulse generator GI to emit corresponding short duration pulses at its output connected to wire 14. Said pulses, together with the signal present on wire 10 at the output of FF1, are sent to an AND gate, denoted by AN2, which transfers them to its output on wire 15, provided a line signal transition from the external zone to the internal zone has taken place less than half signalling period before. In fact only in this case the logic level on wire 10 would be at 1.

The transition to 1 on wire 15 is applied to the clock input of a D-type flip-flop denoted by FF2, whose data input is permanently set at logic level 1, so as to force 1 the logic level at the output connected to wire 17. This signal enables a divide-by-128 counter C2 to begin counting a clock signal with a frequency equal to 128 times the rate of data flow under test. When the counter has counted the 64th pulse, a time period has elapsed equal to half the signalling period and the output of C2, connected to wire 18, passes to logic level 1. This transition is sent through an OR gate, denoted by PO, and wire 16 to reset input of flip-flop FF2, which in turn resets to zero the output of counter C2. As a consequence, at the output of C2 on wire 18 there are only short pulses, exactly delayed by half a signalling period with respect to zero crossings of the analog signal on line. However, counter C2 arrives at the end of its counting only if meanwhile AN1 has not supplied on wire 12 a pulse, which would have reset FF2 output through gate PO and wire 16 and hence caused inhibition of counter C2. As a consequence no pulse would have been emitted on wire 18.

As previously mentioned, the appearance of the pulse on wire 12 in this phase is due to the fact that the transition of line signal is not of the valid type, therefore the relevant zero crossing cannot be used to rebuild the clock signal.

Figure 4:
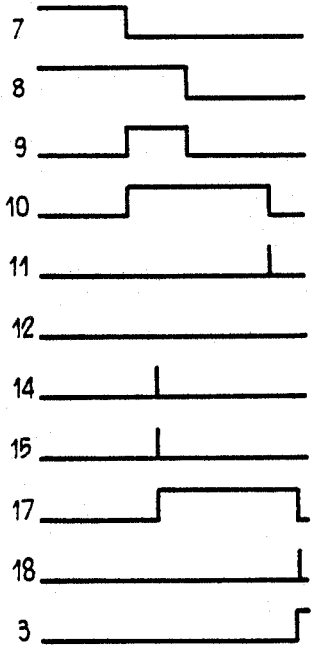
FIGS. 4, 5, 6 are time diagrams relevant to waveforms present at the main points of the circuit of FIG. 2.
Figure 5:
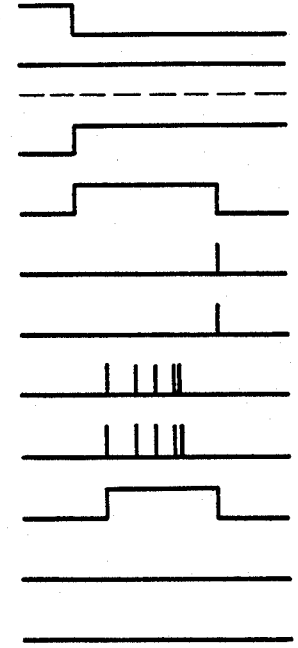
Figure 6:
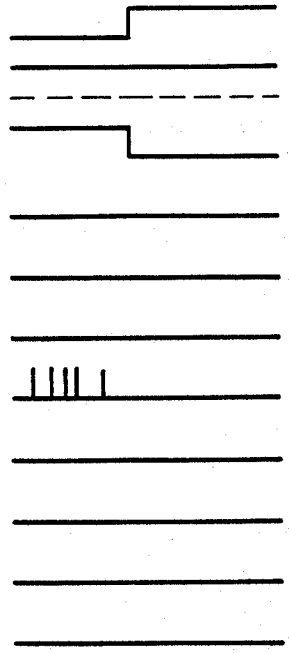

Pulses supplied to C2 on wire 18 are also sent to the reset input of another divide-by-128 counter, still fed with a clock signal with a frequency equal to 128 times the rate of the data flow on the line. The output of C3, connected to wire 3, supplies a square-wave clock signal with the same frequency and the same phase as the line signal. Waveforms present at the main points of the circuit are represented in FIGS. 4, 5 and 6, wherein the line signal undergoes a transition from the positive external zone to the negative external zone, from the positive external zone to the internal zone and from the internal to the positive external zone, respectively. The other possible cases can be easily deduced wherefrom. Each waveform is denoted by the number of the wire where it is present.

It is to be noted that the time interval for which signals 10 and 17 of FIG. 4 are at logic level 1 is equal to half the signalling period, while signal 17 of FIG. 5 is at 1 for a shorter time period, since it is interrupted by the appearance of pulse 12.

In case of the transition 2 of FIG. 6, there is no state change in diagram 10, hence all the zero crossings cannot arrive at the output.

It is clear that what described has been given only by way of non-limiting example. Variations and modifications are possible without going out of the scope of the claims.

I claim:

1. An instrument for measuring the phase jitter of analog signals, wherein a square-wave clock-signal (3) having the same frequency and phase characteristics as the above analog signals (2) is generated by a suitable circuit (SWG) and is compared by a phase comparator (PD) with a reference signal (4), the signal obtained is then filtered by a pass-band circuit (BP), measured and displayed (DI), said circuit (SWG) being characterized in that it comprises:
   a transformer (TI), to the primary winding of which said analog signals (2) are sent;
   a first threshold comparator (CSP), to compare the signal received from the secondary winding of said transformer (TI) with a positive threshold voltage (+s) inferior to the absolute peak value of the input signal;
   a second threshold comparator (CSN), to compare the signal received from the secondary winding of said transformer (TI) with a negative threshold voltage (−s) inferior to the absolute peak value of the input signal;
   an EX-OR gate (EO), receiving at the inputs (7, 8) the signals supplied by said first and second threshold comparators (CSP, CSN);
   a first D-type flip-flop (FF1) with reset input (11), whose data input is permanently set at logic level 1 and clock input (3) is connected to the output of said EX-OR gate (EO);
   a first divide-by-N counter (C1), enabled by said first flip-flop (FF1) to counting a clock signal with a frequency N times higher than the rate of said analog signals, the signal at the output being used to reset said first flip-flop (FF1);
   a first AND gate (AN1), receiving at an input the signal outgoing from said first counter (C1) and at the other input the signal outgoing from said EX-OR gate (EO);
   a third threshold comparator (CSO), to detect the zero crossings of the signal received from the secondary winding of said transformer (TI);
   a pulse generator (GI), generating short-duration pulses in correspondance with signal transitions at the output of said third threshold comparator (CSO);
   a second AND gate (AN2), receiving at an input the signal outgoing from said pulse generator (GI) and at the other input the signal outgoing from said first flip-flop (FF1);
   a second D-type flip-flop (FF2) with reset input (16), whose data input is permanently set at logic level 1 and the clock input (15) is connected to the output of said second AND gate (AN2);
   as second divide-by-N counter (C2), enabled by said second flip-flop (FF2) to counting the clock signal with a frequency N times higher than the rate of said analog signals;
   an OR gate (PO), receiving at an input the signal outgoing from said second counter (C2) and at the other input the signal outgoing from said first AND gate (AN1), the outgoing signal being used to reset said second flip-flop (FF2);
   a third divide-by-N counter (C3), which counts the clock signal with a frequency N times higher than the rate of said analog signals and is reset by said second counter (C2), the outgoing signal (3) being said square-wave clock signal with the same frequency and phase characteristics as the above analog signals (2).

2. An instrument for measuring the phase jitter of analog signals as in claim 1, characterized in that said N is equal to 128.

3. An instrument for measuring the phase jitter of analog signals as in claim 1, characterized in that the absolute value of said threshold voltages of said first and second threshold comparators (CSP, CSN) is equal to about half the peak value of the input signal.

* * * * *